(12) United States Patent
Wu

(10) Patent No.: US 9,903,889 B1
(45) Date of Patent: Feb. 27, 2018

(54) PROBE CONNECTOR ASSEMBLY

(71) Applicant: TEK CROWN TECHNOLOGY CO., LTD, Taoyuan (TW)

(72) Inventor: Hsin-Lung Wu, Taoyuan (TW)

(73) Assignee: TEK CROWN TECKNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 15/390,581

(22) Filed: Dec. 26, 2016

(51) Int. Cl.
*G01R 1/067* (2006.01)
*G01R 1/073* (2006.01)
*G01R 1/04* (2006.01)

(52) U.S. Cl.
CPC ....... *G01R 1/07371* (2013.01); *G01R 1/0416* (2013.01); *G01R 1/0491* (2013.01); *G01R 1/06716* (2013.01)

(58) Field of Classification Search
CPC ............ G01R 1/07371; G01R 1/06716; G01R 1/0416; G01R 1/0491
USPC ....................................... 324/755.01, 755.11
See application file for complete search history.

(56) References Cited

U.S. PATENT DOCUMENTS

2003/0048108 A1* 3/2003 Beaman ............... B23K 20/004
324/755.11

* cited by examiner

*Primary Examiner* — Farhana Hoque
(74) *Attorney, Agent, or Firm* — Alan D. Kamrath; Kamrath IP Lawfirm, P.A.

(57) ABSTRACT

A probe connector assembly includes a carrier plate, multiple probes and multiple positioning members. The multiple probes are mounted into multiple probe holes of the carrier plate. Each positioning member is securely mounted into the carrier plate and partially protrudes into corresponding probe holes to contact probe trunks of corresponding probes, such that the probe trunk of each probe is positioned in a corresponding probe hole of the carrier plate by friction resistance generated between the probe trunk and positioning members adjacent to the probe trunk. Thus, the probe connector assembly is advantageous in a simplified structure of the carrier plate and reduced thickness of the carrier plate and probe length.

18 Claims, 15 Drawing Sheets

PROBE CONNECTOR ASSEMBLY

BACKGROUND OF THE INVENTION

1. Field of the Invention

The present invention relates to a probe connector assembly and, more particularly, to a probe connector assembly capable of being used in various types of testing fixtures for electrical connection with wafer testing probe cards or semiconductor test equipment.

2. Description of the Related Art

Current testing fixtures applied to wafer testing probe cards or semiconductor test equipment provide probe connector assembly for the purpose of electrical connection. Given the probe connector assembly for semiconductor test fixtures as an example, with reference to FIG. 15, a conventional probe connector assembly includes a board 60, multiple probes 70 and a probe cover 61. The board 60 has multiple probe holes. One end (an upper end or a lower end) of each probe hole has a smaller inner diameter than the other'end. The multiple probes 70 are mounted into the respective probe holes of the board 60. Each probe is held and positioned by an inner wall of the end with the smaller inner diameter of one of the multiple probe holes. The probe cover 61 has multiple through holes. The multiple through holes are smaller than the probe holes in inner diameter. The probe cover 61 is fastened on and covers the ends of the probe holes with a larger inner diameter. In the event that the ends of the probe holes with the smaller inner diameter are the lower ends, the probe cover 61 is mounted on a top surface of the board 60. In the event that the ends of the probe holes with the smaller inner diameter are the upper ends, the probe cover 61 is mounted on a bottom surface of the board 60. By virtue of a carrier board structure combining the probe cover 61 and the board 60, the multiple probes 70 can be positioned within the carrier board structure with upper contact portions and lower contact portions of the probes 70 respectively extending out of the board 60 and the probe cover 61.

With further reference to FIG. 15, the conventional probe connector assembly that is applicable to semiconductor test equipment is mounted on a circuit carrier board 80, such that each probe 70 of the probe connector assembly is electrically connected with a corresponding contact on the circuit carrier board and is further electrically connected to a testing system through the circuit carrier board 80. When a semiconductor component 50 to be tested is placed on the probe connector assembly and is then pressed down for each contact point on a bottom of the semiconductor component 50 to be in electrical contact with a corresponding probe 70, the testing system tests the semiconductor component 50 for open-circuit test, short-circuit test and functionality tests to determine if the semiconductor component 50 functions normally.

Although the probe connector assembly can be applied to various types of test fixtures for electrical connection with wafer or semiconductor component to be tested, the conventional probe connector assembly needs to have the probe cover 61 additionally mounted on the board 60. Under the circumstance that the entire probes 70 need to be positioned by the carrier board structure combining the board 60 and the probe cover 61, issues in cost and structural complexity arise from the need of the carrier board structure. Additionally, when the carrier board structure is aligned with the probes in assembly, the alignment oftentimes becomes uneasy because of the carrier board structure deformed by the press-down semiconductor component to be tested and causes unsmooth assembly.

Furthermore, as the positioning of the probes 70 relies on the carrier board structure combining the board 60 and the probe cover 61, the conventional probe connector assembly tends to be thick and requires the probes to be longer in length, making the conventional probe connector assembly hardly applicable for assembly with shorter probes. Meanwhile, longer probes result in longer signal transmission distance, which is unfavorable to tests of wafers or semiconductor components.

SUMMARY OF THE INVENTION

An objective of the present invention is to provide a probe connector assembly resolving the problems of installation inconvenience, high cost, thick carrier plate and long probe encountered in assembly of conventional probe connector assemblies.

To achieve the foregoing objective, the probe connector assembly includes a carrier plate, multiple probes, and multiple positioning members.

The carrier plate has multiple probe holes spaced apart from each other and arranged in top-down alignment. Each probe hole has a hole portion and an end portion connected with one end of the hole portion and being smaller than the hole portion in diameter.

The multiple probes are mounted in the respective probe holes of the carrier plate. Each probe has a probe trunk, a probe head, a probe tip and a conducting part.

The probe trunk is mounted inside the hole portion of a corresponding probe hole with one end of the probe trunk limited by the end portion of the corresponding probe hole.

The probe head is formed on a top end of the probe trunk and extends beyond a top surface of the carrier plate.

The probe tip is formed on a bottom end of the probe trunk.

The conducting part with an elastic portion is stretchable in length. The elastic portion is selectively combined with one of the probe head and the probe tip.

The multiple positioning members are securely mounted into a bottom portion of the carrier plate. Each positioning member partially protrudes into the probe holes adjacent thereto to contact the probe trunks of the probes in the probe holes. The probe trunk of each probe is positioned in a corresponding probe hole of the carrier plate by friction resistance generated between the probe trunk and the positioning members adjacent to the probe trunk.

The foregoing probe connector assembly mainly includes multiple probes respectively mounted in the multiple probe holes of the carrier plate and multiple positioning members securely mounted into the carrier plate and contacting the probe trunks of the probes adjacent to the positioning members, such that the probe trunk of each probe is positioned in a corresponding probe hole of the carrier plate by friction resistance generated between the probe trunk and the positioning members adjacent to the probe trunk. Only few probes are positioned in the carrier plate by the positioning members to avoid the necessity of a probe cover with multiple through holes additionally mounted on a top or a bottom of a conventional probe connector assembly and installation inconvenience arising from alignment of the probe cover and entire probes.

In view of the removal of the probe cover, the structure of the probe connector assembly can be simplified to ease production and save cost. In comparison with the conventional probe connector assemblies using a probe positioning structure combining the board and the probe cover, the present invention can reduce the thickness of the carrier plate and the length of the probes to facilitate the assembly and operation for short probes and shorten signal transmission distance through the probes. Accordingly, the present invention is applicable to various types of testing fixtures to enhance testing performance thereof.

Also because of the removal of the probe cover, during the assembly and replacement process of the probes, the probes can be directly installed and replaced with tools to ease replacement of small amount of probes and facilitate precise operation.

Other objectives, advantages and novel features of the invention will become more apparent from the following detailed description when taken in conjunction with the accompanying drawings.

DETAILED DESCRIPTION OF THE INVENTION

With reference to FIGS. 1, 4, 7, 8, 12 and 13, each of the first to sixth embodiments of a probe connector assembly in accordance with the present invention includes a carrier plate 10, 10A, 10B, 10C, 10D, 10E, multiple probes 20, 20A, 20B, 20C, 20D, 20E and multiple positioning members 30, 30A, 30B, 30C, 30D, 30E.

Figure 2:
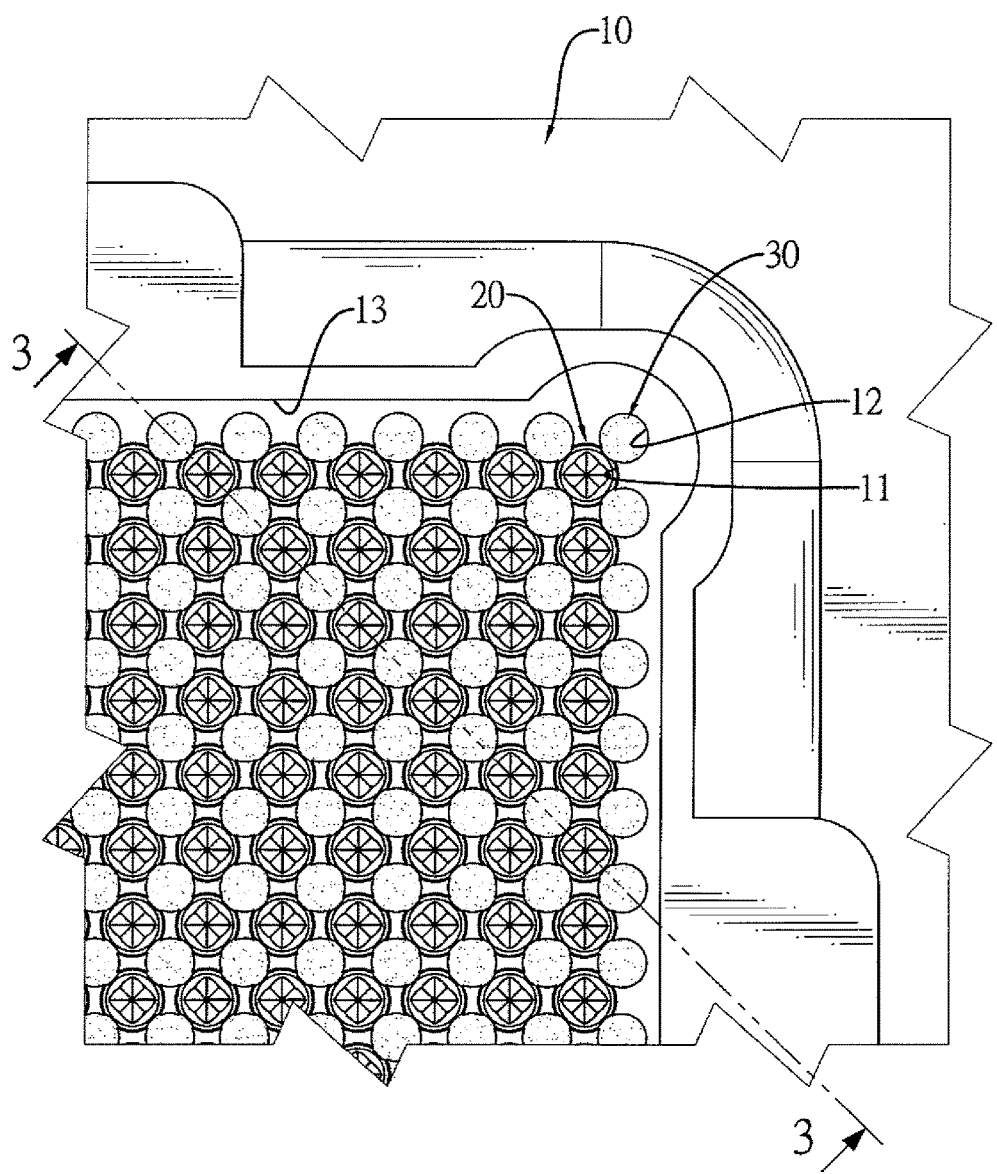
FIG. 2 is a partially enlarged view of the probe connector assembly in FIG. 1.
Figure 3:
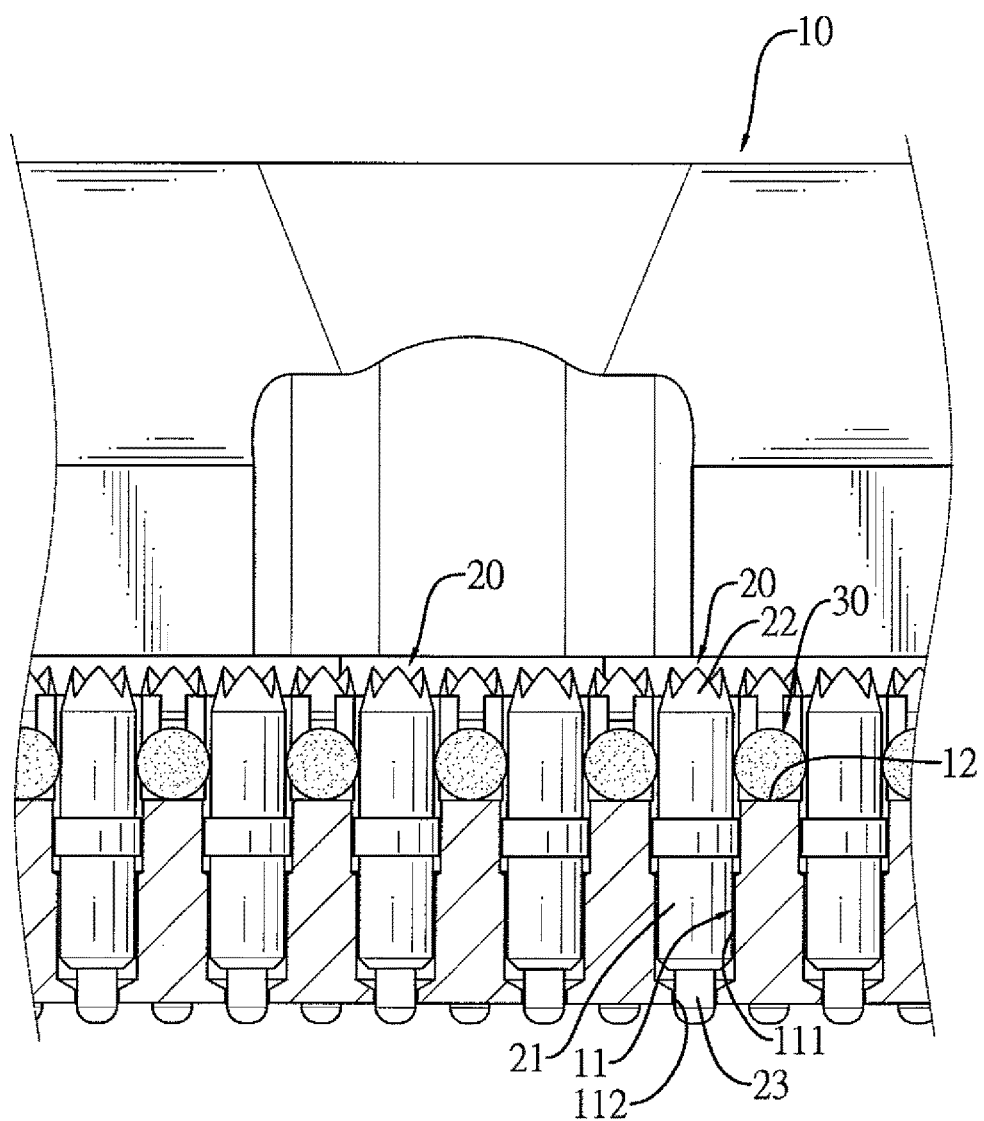
FIG. 3 is a partial cross-sectional view of the probe connector assembly taken along line A-A in FIG. 2.
Figure 4:
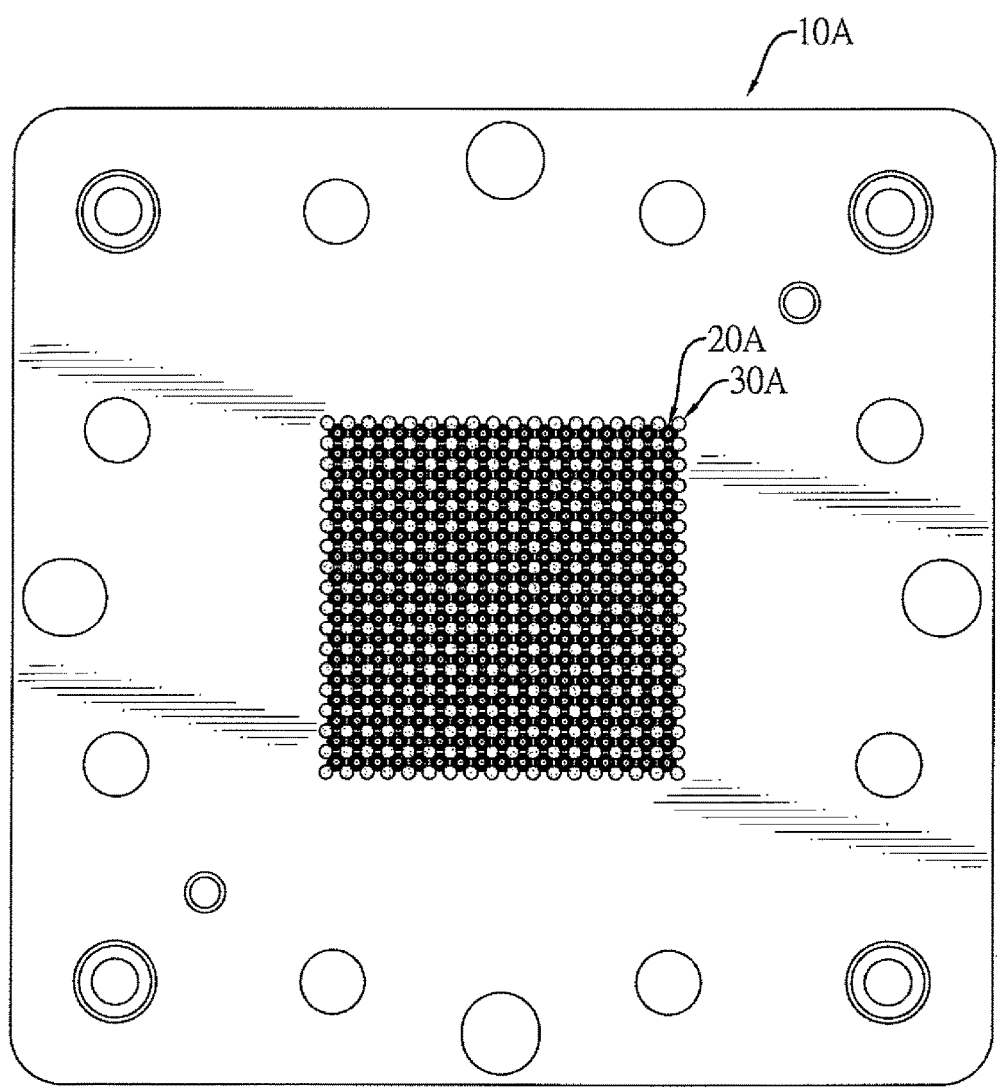
FIG. 4 is a top view of a second embodiment of a probe connector assembly in accordance with the present invention.
Figure 5:
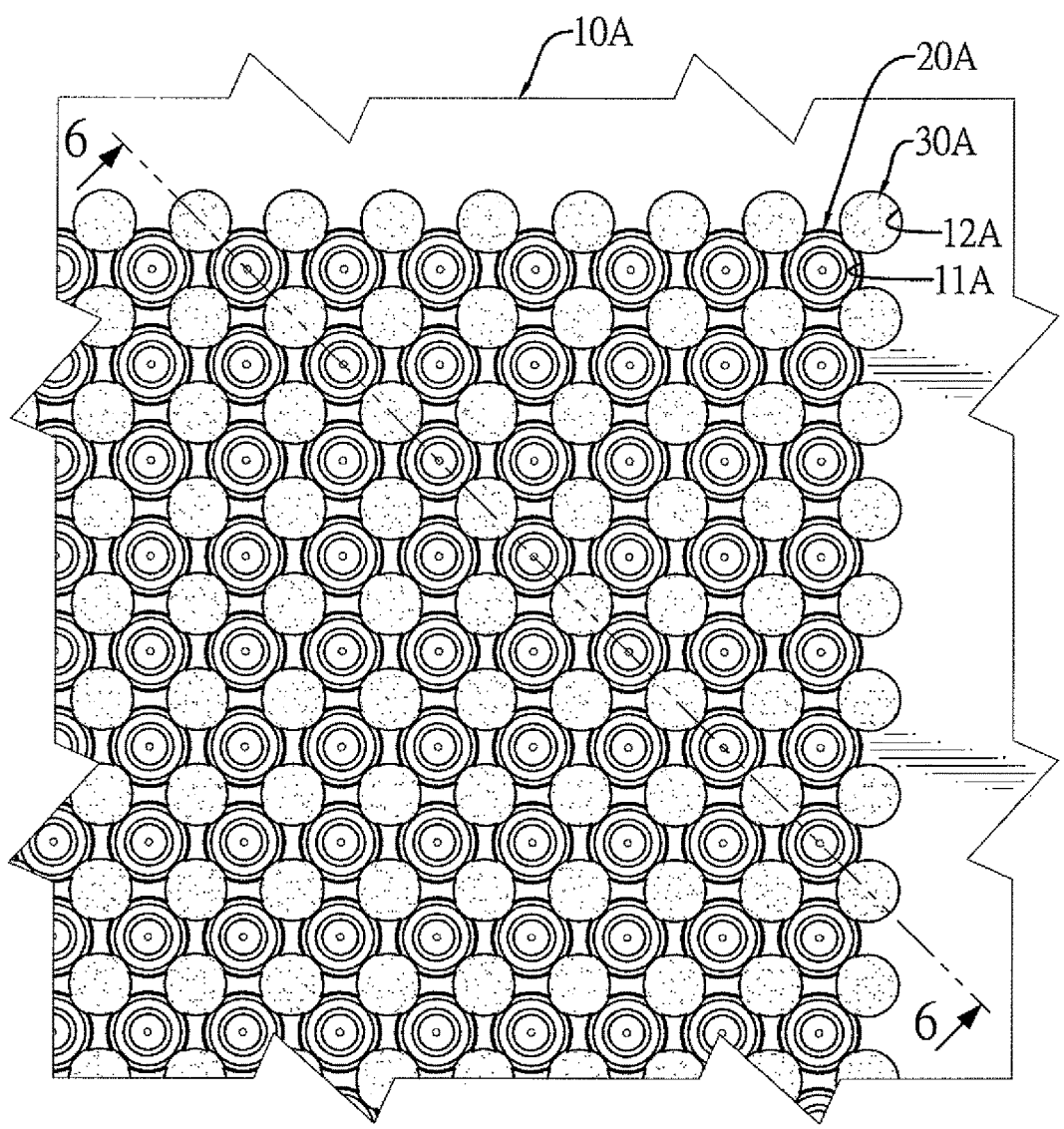
FIG. 5 is a partially enlarged view of the probe connector assembly in FIG. 4.
Figure 6:
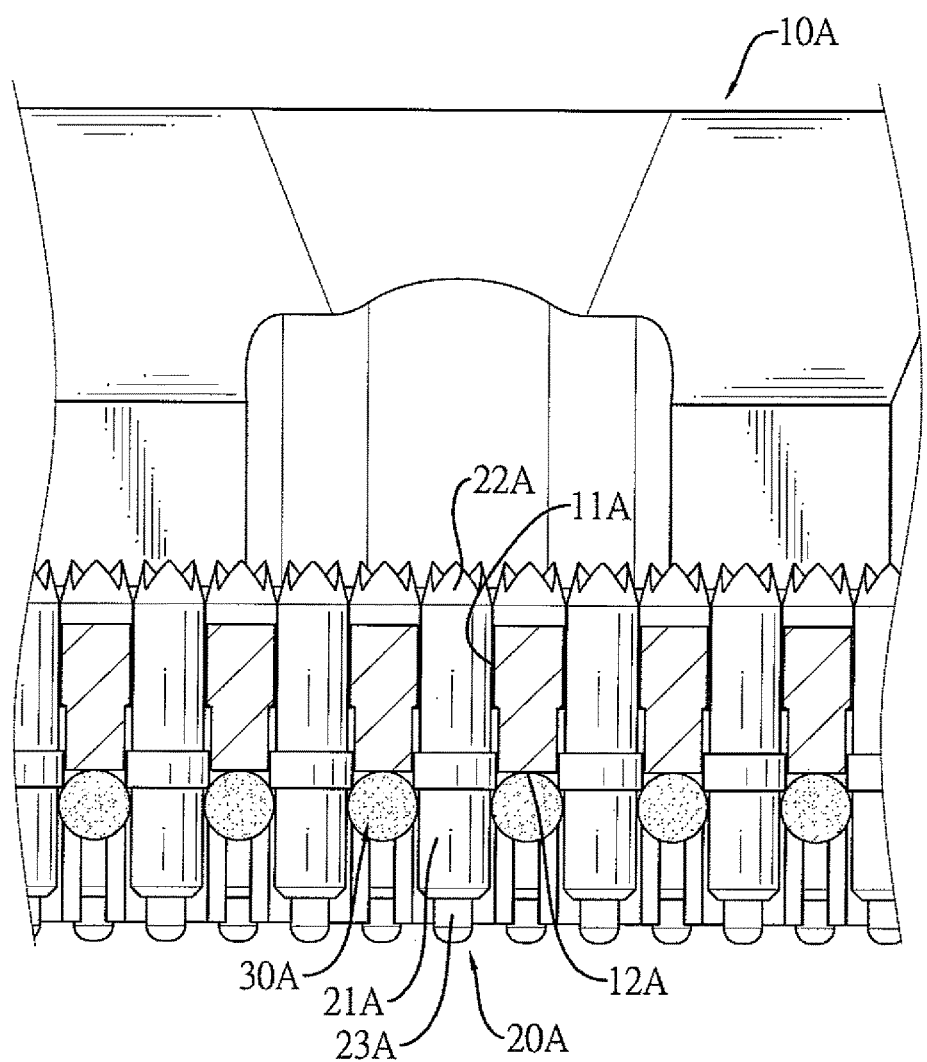
FIG. 6 is a partial cross-sectional view of the probe connector assembly taken along line B-B in FIG. 5.
Figure 7:
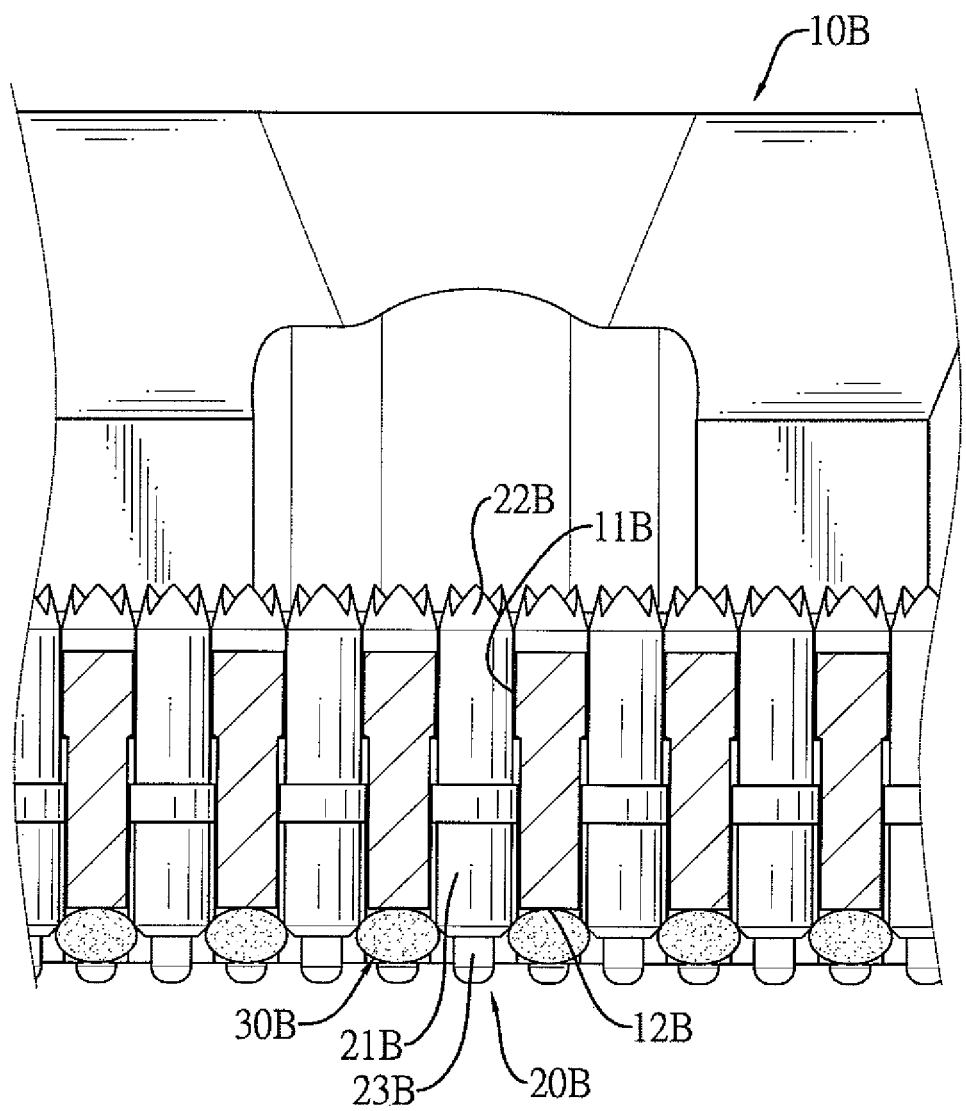
FIG. 7 is a partial cross-sectional view of a third embodiment of a probe connector assembly in accordance with the present invention.
Figure 8:
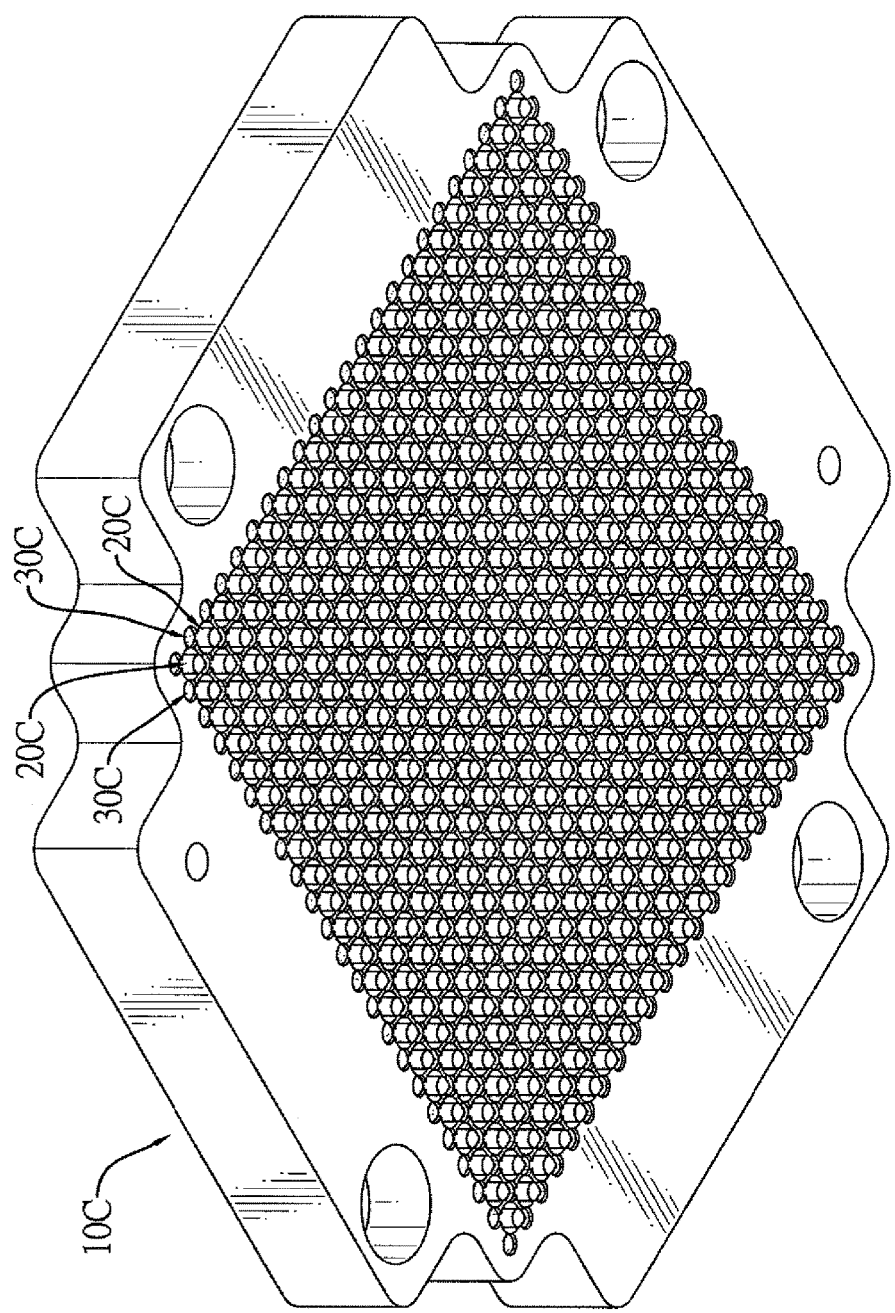
FIG. 8 is a perspective view of a fourth embodiment of a probe connector assembly in accordance with the present invention when viewed from a point below the probe connector assembly.
Figure 9:
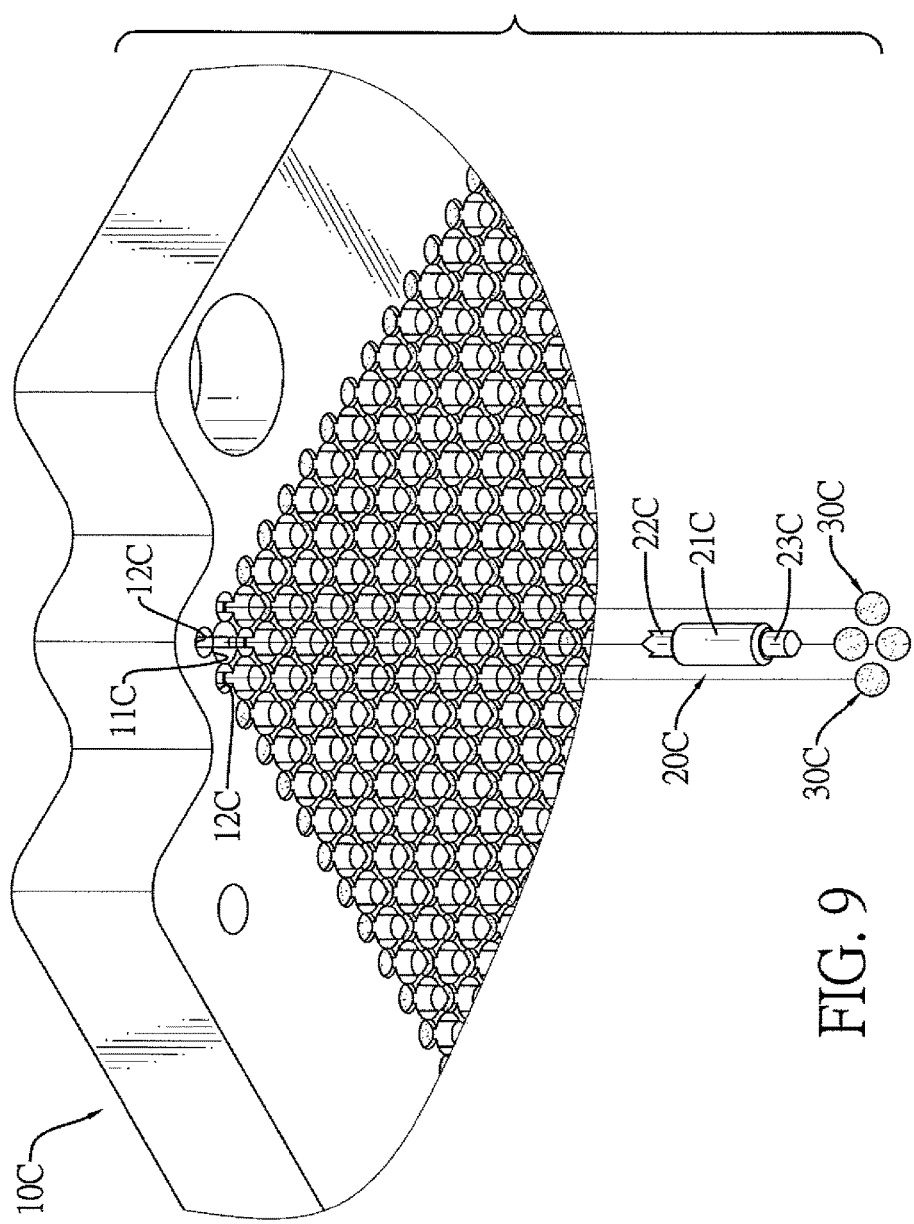
FIG. 9 is a partially exploded perspective view of the probe connector assembly in FIG. 8.
Figure 10:
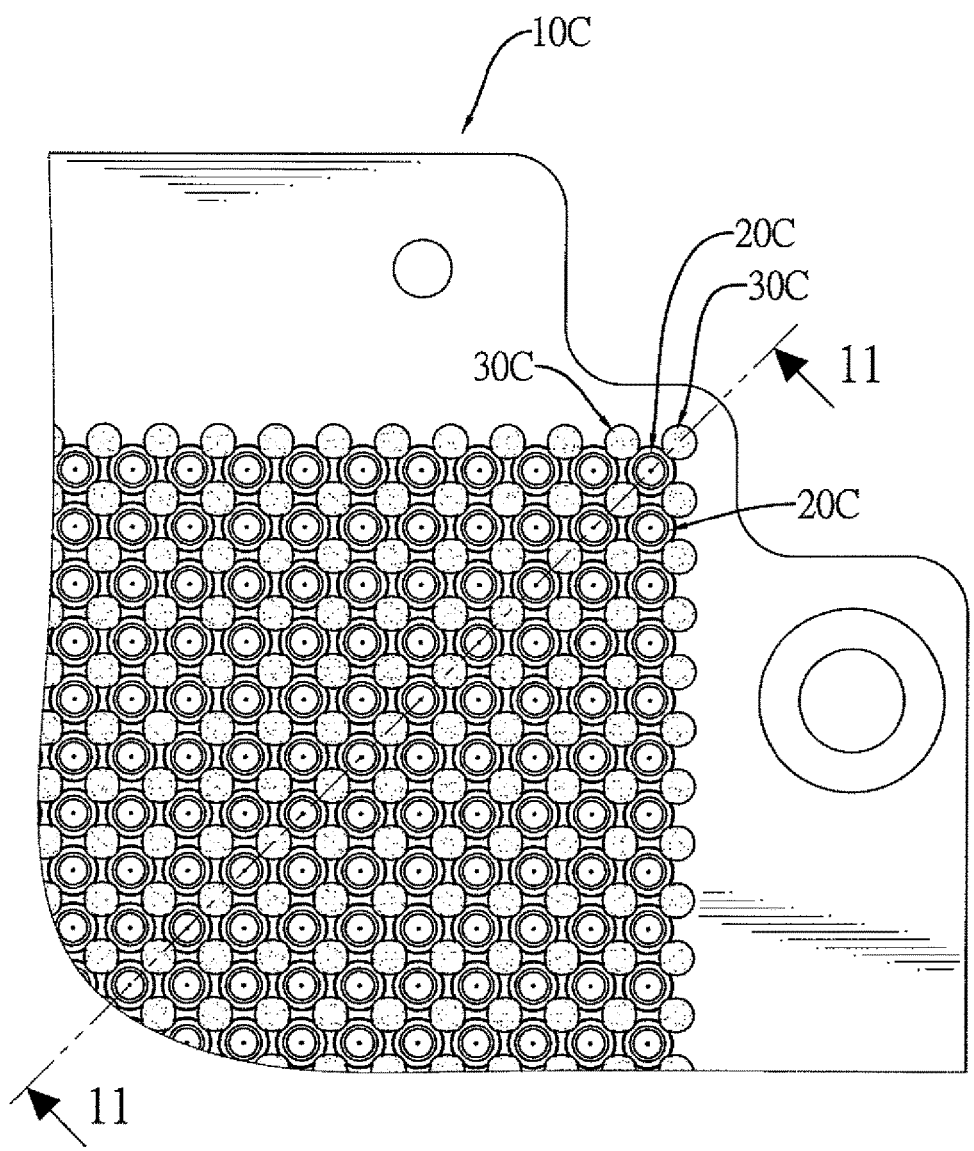
FIG. 10 is a partial top view of the probe connector assembly in FIG. 8.
Figure 11:
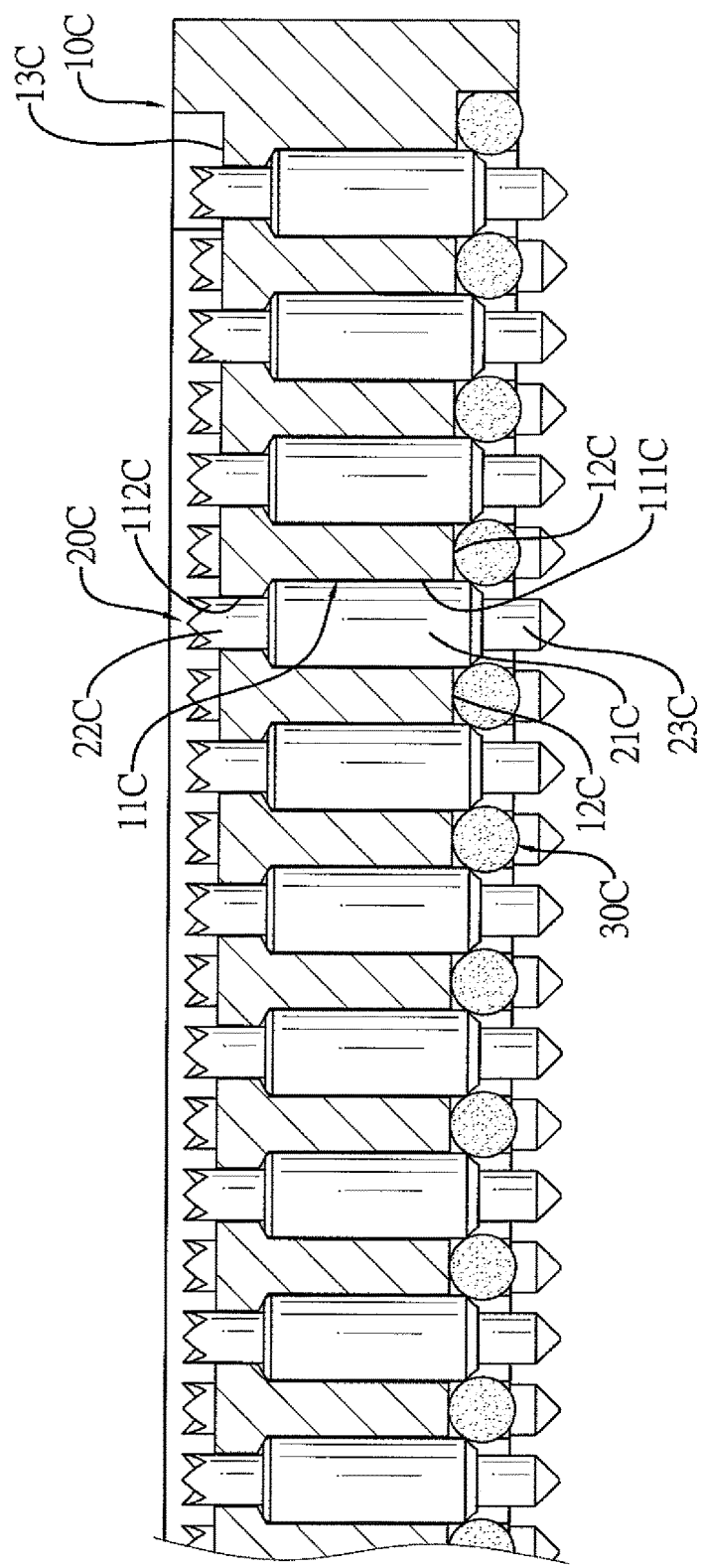
FIG. 11 is a cross-sectional view of the probe connector assembly taken along line C-C in FIG. 10.
Figure 12:
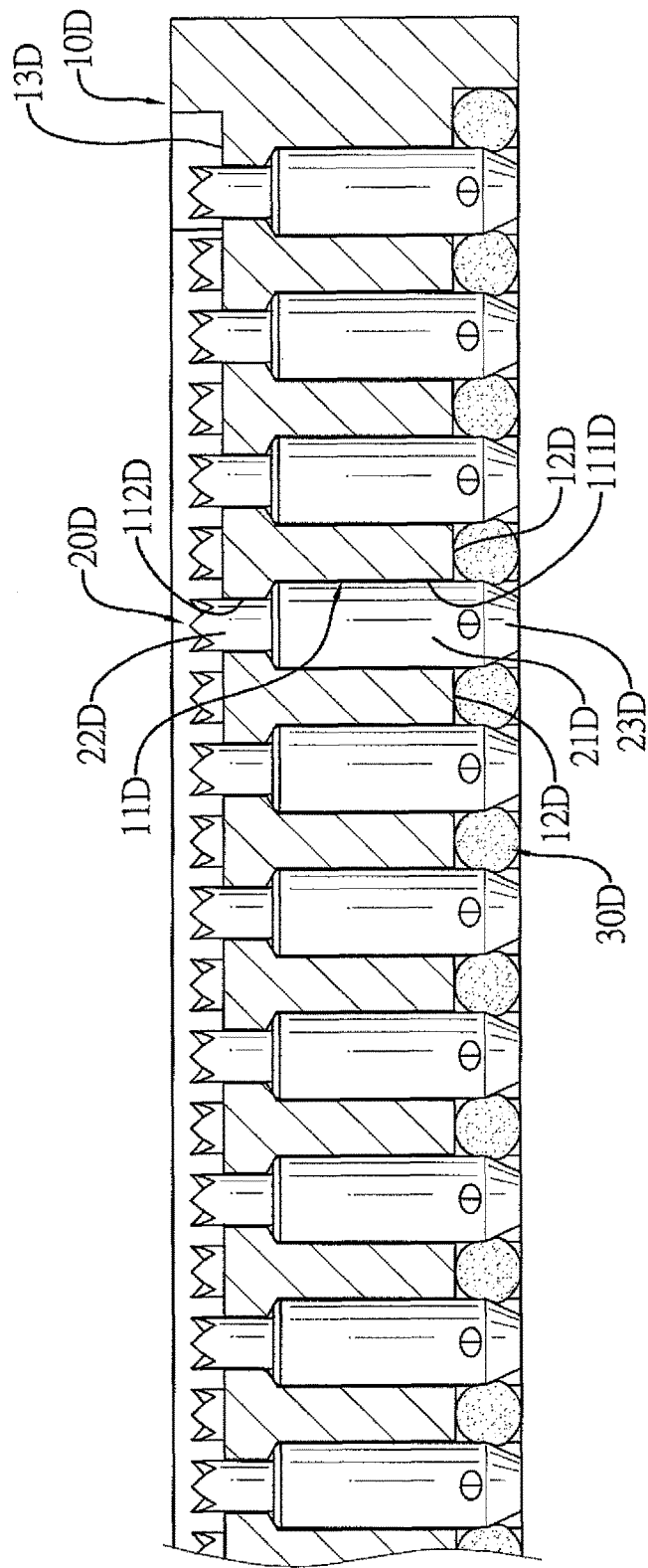
FIG. 12 is a partial cross-sectional view of a fifth embodiment of a probe connector assembly in accordance with the present invention.

With reference to FIGS. 2 and 3, 5 and 6, 7, 9 to 11, 12 and 13, the carrier plate 10, 10A, 10B, 10C, 10D, 10E may be made from an insulating material, the carrier plate 10, 10A, 10B, 10C, 10D, 10E has multiple probe holes 11, 11A, 11B, 11C, 11D, 11E formed therein, and the multiple probe holes 11, 11A, 11B, 11C, 11D, 11E are spaced apart from each other and are arranged in top-down alignment. Configuration of diameter, distribution and gap for the multiple probe holes 11, 11A, 11B, 11C, 11D, 11E depends on the type of probe connector assembly. With reference to FIGS. 3, 11 and 12, each probe hole 11, 11C, 11D has a hole portion 111, 111C, 111D and an end portion 112, 112C, 112D connected with one end of the hole portion 111, 111C, 111D. With reference to FIG. 3, the end portion 112 may be located under the hole portion 111. Alternatively, with reference to FIG. 11 or 12, the end portion 112C, 112D may be located above the hole portion 111C, 111D.

Figure 1:
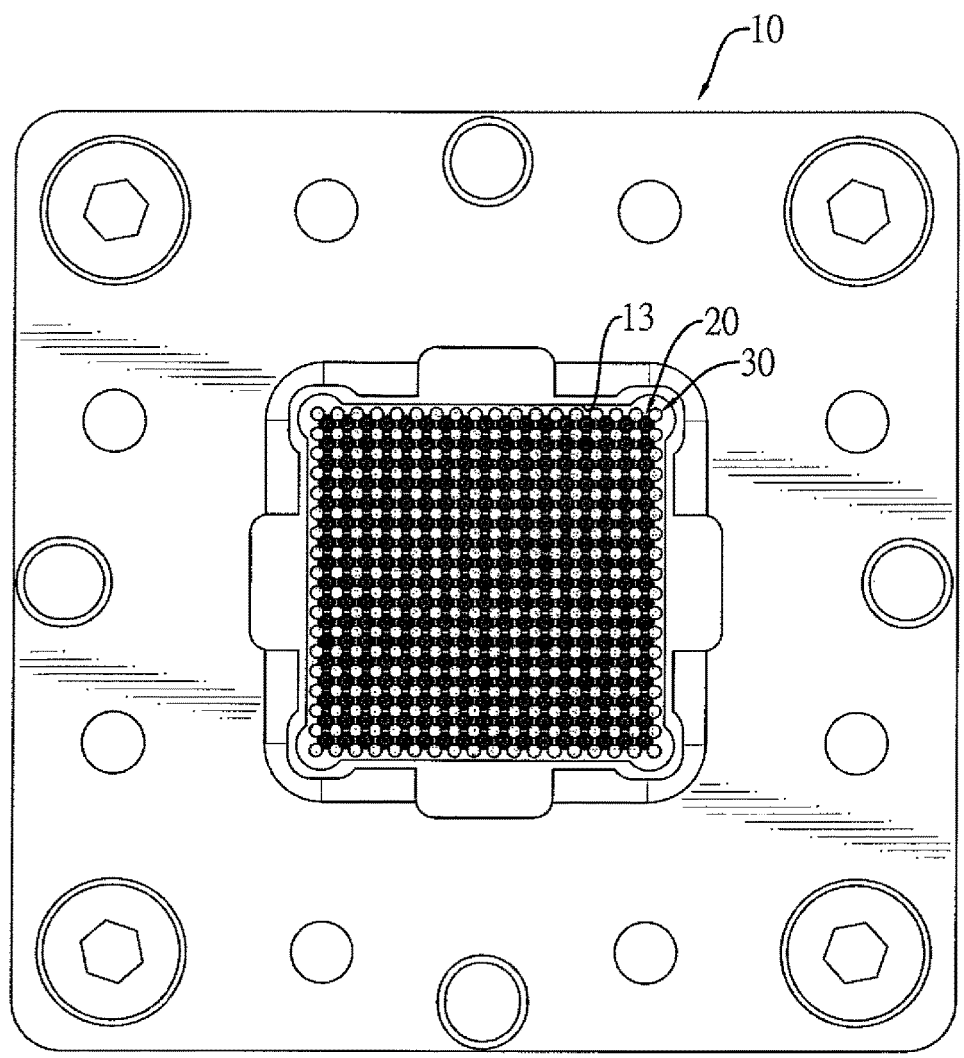
FIG. 1 is a top view of a first embodiment of a probe connector assembly in accordance with the present invention.

With reference to FIGS. 1, 4, 7, 8, 12 and 13, the carrier plate 10, 10A, 10B, 10C, 10D, 10E may be made as a seat plate capable of carrying semiconductor component according to product type and purpose of the probe connector assembly as illustrated in FIG. 1 to 3, 4-6 or 7, or made as a panel as illustrated in FIGS. 8 and 11, 12 or 13. When the carrier plate 10, 10A, 10B pertains to a seat plate capable of carrying a semiconductor component, given the example as illustrated in FIG. 1, the carrier plate 10 has a placement recess 13 where the multiple probe holes 11 are distributed over a bottom wall of the placement recess 13.

With reference to FIGS. 1, 4, 7, 8, 12 and 13, distribution patterns of the multiple probe holes 11, 11A, 11B, 11C, 11D, 11E of the carrier plate 10, 10A, 10B, 10C, 10D, 10E are configured according to distribution patterns of contact points of a wafer or a semiconductor component, such as BGA (Ball Grid Array) components, QFP (Quad Flat Package) components or QFN (Quad Flat No-Lead) components, to be tested in connection with the probe connector assembly. The multiple probe holes 11, 11A, 11B, 11C, 11D, 11E may be arranged in the form of a matrix on the carrier plate 10, 10A, 10B, 10C, 10D, 10E. Alternatively, the multiple probe holes may take a rectangular form with the multiple probe holes distributed along four edges of the rectangle.

With reference to FIGS. 3, 6, 7, 9, 10, 11, 12 and 13, each probe 20, 20A, 20B, 20C, 20D, 20E has a conducting part with an elastic portion being stretchable in length. With reference to FIGS. 3, 6, 7, 9, 10, 11 and 12, each probe 20, 20A, 20B, 20C, 20D has a probe trunk 21, 21A, 21B, 21C, 21D, a probe head 22, 22A, 22B, 22C, 22D formed on a top end of the probe trunk 21, 21A, 21B, 21C, 21D, and a probe tip 23, 23A, 23B, 23C, 23D formed on a bottom end of the probe trunk 21, 21A, 21B, 21C, 21D. The probes 20, 20A, 20B, 20C, 20D are mounted in the respective probe holes 11, 11A, 11B, 11C, 11D of the carrier plate 10, 10A, 10B, 10C, 10D. The probe trunks 21, 21A, 21B, 21C, 21D are mounted into the hole portions 111, 111A, 111B, 111C, 111D of the respective probe holes 11, 11A, 11B, 11C, 11D. One end of each probe trunk 21, 21A, 21B, 21C, 21D is limited by the end portion 112, 112C, 112D of a corresponding probe hole 11, 11A, 11B, 11C, 11D. The probe heads 22, 22A, 22B, 22C, 22D, 22E extend beyond a top surface of the carrier plate 10, 10A, 10B, 10C, 10D, 10E through top ends of the hole portions 111, 111A, 111B, 111C, 111D of the respective probe holes 11, 11A, 11B, 11C, 11D. The probe tips 23, 23A, 23B, 23C, 23D extend beyond a bottom surface of the carrier plate 10, 10A, 10B, 10C, 10D through bottom ends of the hole portions 111, 111A, 111B, 111C, 111D of the respective probe holes 11, 11A, 11B, 11C, 11D. Alternatively, tip portions of the probe tips 23, 23A, 23B, 23C, 23D may be flush with the bottom surface of the carrier plate 10, 10A, 10B, 10C, 10D. In other words, the tip portions of the probe tips 23, 23A, 23B, 23C, 23D are either identical to or approximately the same as the bottom surface of the carrier plate 10, 10A, 10B, 10C, 10D in height.

The probes may be single-end stretchable probes or dual-end stretchable probes. In the case of single-end stretchable probes, the probe heads may be stretchable relative to the probe trunks while the probe tips are fixedly attached to the bottom ends of the probe trunks. In the case of dual-end stretchable probes, the probe heads and the probe tips may be both stretchable relative to the probe trunks. With reference to FIGS. 3, 6, 7 and 11, the probe tips 23, 23A, 23B, 23C are stretchable relative to the respective probe trunks 21, 21A, 21B, 21C. With reference to FIG. 12, the probe tips 23 are fixedly attached to the bottom ends of the respective probe trunks 21D.

Further to the foregoing description, the probe heads may be combined with elastic parts inside the probe trunks to be stretchable relative to the top ends of the respective probe trunks, and the probe tips may be also combined with the elastic parts or different elastic parts inside the probe trunks to be stretchable relative to the bottom ends of the respective probe trunks. The probe tips may be integrally formed with the bottom ends of the respective probe trunks. The elastic parts may be springs or leaf springs.

With reference to FIGS. 2 and 3, 5 and 6, 7, 11, and 12, the multiple positioning members 30, 30A, 30B, 30C, 30D, 30E are made from an insulating material and are securely mounted to the carrier plate 10, 10A, 10B, 10C, 10D, 10E. The positioning members 30, 30A, 30B, 30C, 30D, 30E may be mounted to the carrier plate 10, 10A, 10B, 10C, 10D, 10E by tight-fit and partially protrude into the respective probe holes 11, 11A, 11B, 11C, 11D, 11E to contact the probe trunks 21, 21A, 21B, 21C, 21D of the respective probes 20, 20A, 20B, 20C, 20D, 20E. One end of the probe trunk 21, 21A, 21B, 21C, 21D of each probe 20, 20A, 20B, 20C, 20D, 20E abuts against a portion of an inner wall of a corresponding probe hole 11, 11A, 11B, 11C, 11D, 11E between the hole portion 111, 111A, 111B, 111C, 111D and the end portion 112, 112A, 112B, 112C of the corresponding probe hole 11, 11A, 11B, 11C, 11D, 11E. The probe trunk 21, 21A, 21B, 21C, 21D of each probe 20, 20A, 20B, 20C, 20D, 20E is positioned in a corresponding probe hole 11, 11A, 11B, 11C, 11D, 11E by friction resistance generated between the positioning members 30, 30A, 30B, 30C, 30D, 30E and the probe 20, 20A, 20B, 20C, 20D, 20E.

With further reference to FIGS. 2 and 3, the carrier plate 10 further has multiple positioning recesses 12 formed in a top thereof. Each positioning recess 12 communicates with top portions of the probe holes 11 adjacent to the positioning recess 12, and each probe hole 11 communicates with the multiple positioning recesses 12. The multiple positioning members 30 are mounted into the respective positioning recesses 12. One portion of each positioning member 30 protrudes into the probe holes 11 adjacent to the positioning member 30 to contact upper portions of the probe trunks 21 of the probes 20 in the probe holes 11. Thus, the upper portion of the probe trunk 21 of each probe 20 is positioned in a corresponding probe hole 11 in the carrier plate 10 by friction resistance generated by the positioning members 30 that are adjacent to the probe 20 and abut against the probe trunk 21.

With reference to FIGS. 4-6, 7, 11, 12 and 13, the carrier plate 10A, 10B, 10C, 10D, 10E has multiple positioning recesses 12A, 12B, 12C, 12D, 12E formed in a bottom thereof. Each positioning recess 12A, 12B, 12C, 12D, 12E communicates with bottom portions of the probe holes 11A, 11B, 11C, 11D, 11E adjacent thereto. Each probe hole 11A, 11B, 11C, 11D, 11E communicates with multiple positioning recesses 12A, 12B, 12C, 12D, 12E adjacent thereto. The multiple positioning members 30A, 30B, 30C, 30D, 30E are mounted into the respective positioning recesses 12A, 12B, 12C, 12D, 12E. One portion of each positioning member 30A, 30B, 30C, 30D, 30E protrudes into the probe holes 11A, 11B, 11C, 11D, 11E adjacent thereto to contact middle portions or lower portions of the probe trunks 21A, 21B, 21C, 21D of the probes 20A, 20B, 20C, 20D, 20E in the probe holes 11A, 11B, 11C, 11D, 11E, such that the middle portion or the lower portion of the probe trunk 21A, 21B, 21C, 21D of each probe 20A, 20B, 20C, 20D, 20E is positioned in a corresponding probe hole 11A, 11B, 11C, 11D, 11E in the carrier plate 10 by friction resistance generated by the positioning members 30A, 30B, 30C, 30D, 30E that are adjacent to the probe 20A, 20B, 20C, 20D, 20E and abut against the probe trunk 21A, 21B, 21C, 21D.

Figure 13:
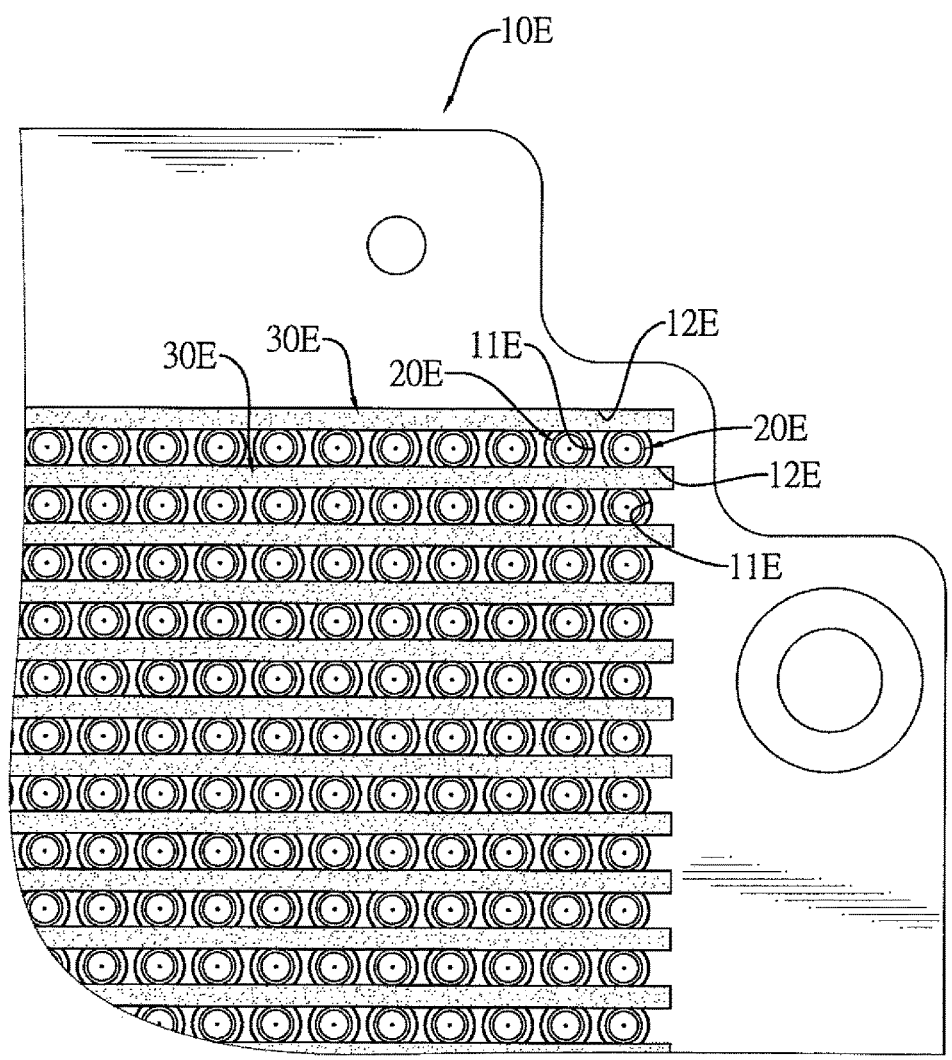
FIG. 13 is a partial top view of a sixth embodiment of a probe connector assembly using an elongated positioning member in accordance with the present invention.

With reference to FIGS. 1 to 3, 6, 7, and 11 to 13, the multiple probe holes 11, 11A, 11B, 11C, 11D, 11E of the carrier plate 10, 10A, 10B, 10C, 10D, TOE are arranged in the form of a matrix. Each probe hole 11, 11A, 11B, 11C, 11D, 11E communicates with multiple positioning recesses 12, 12A, 12B, 12C, 12D, 12E adjacent thereto. Each positioning recess 12, 12A, 12B, 12C, 12D, 12E may be a hole or an elongated groove. With reference to FIGS. 3, 6, 11 and 12, when each positioning recess 12, 12A, 12B, 12C, 12D pertains to a hole, each probe hole 11, 11A, 11B, 11C, 11D communicates with four hole-like positioning recesses 12, 12A, 12B, 12C, 12D adjacent thereto. With reference to FIG. 13, when each positioning recess 12E pertains to an elongated groove, each row of probe holes 11E communicate with two elongated positioning recesses 12E adjacent thereto. With reference to FIGS. 11 and 12, the carrier plate 10C, 10D further has an indentation 13C, 13D and the probe holes 11C, 11D are formed in and distributed over a bottom of the indentation 13C, 13D.

With reference to FIGS. 2, 3, 5, 6, and 7 to 13, the positioning members 30, 30A, 30B, 30C, 30D, 30E may be insulating and take the form of a block, a sphere or a bar. When the positioning recesses 12, 12A, 12B, 12C, 12D distributed over a top portion or a bottom portion of the carrier plate 10, 10A, 10B, 10C, 10D pertain to holes, the positioning members 30, 30A, 30B, 30C, 30D are blocks or spheres corresponding to the positioning recesses 12, 12A, 12B, 12C, 12D in shape, which allow the top end or the bottom end of the probe trunk 21, 21A, 21B, 21C, 21D of each probe 20, 20A, 20B, 20C, 20D to be positioned in a corresponding probe hole 11, 11A, 11B, 11C, 11C, 11D of the carrier plate 10, 10A, 10B, 10C, 10D and held by four positioning members 30, 20A, 30B, 30C, 30D adjacent to the probe 20, 20A, 20B, 20C, 20D by friction resistance generated between the positioning members 30, 30A, 30B, 30C, 30D. With reference to FIG. 13, when the positioning recesses 12E pertain to elongated grooves, the positioning members 30E are bars corresponding to the positioning recesses 12 E in shape, which allows the bottom end of the probe trunks of each row of probes 20E to be positioned in the corresponding probe holes 11E by friction resistance generated between the row of probes 20E and two of the positioning members 30E adjacent to row of probes 20E.

Besides, the positioning members may be annular and each positioning member is fixed in a corresponding probe hole of the carrier plate or fixed in an annular recess formed in the bottom surface of the carrier plate and communicating with the corresponding probe hole, such that the probe trunk of each probe is positioned in a corresponding probe hole of the carrier plate by friction resistance generated between the positioning member and the probe trunk.

Figure 14:
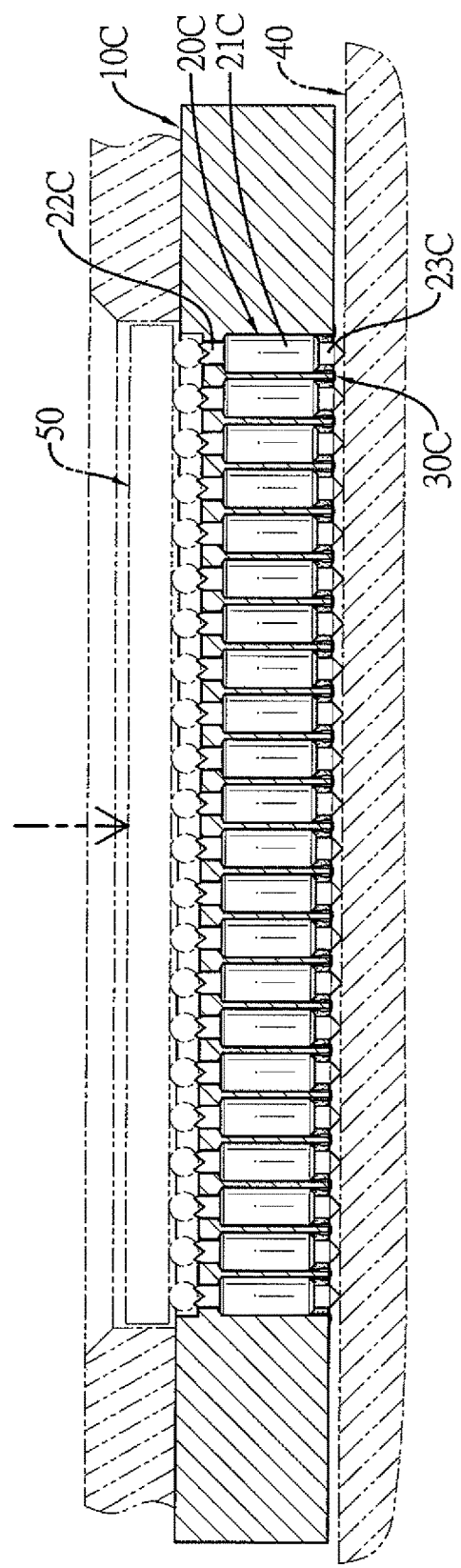
FIG. 14 is an operational cross-sectional view of the probe connector assembly in FIG. 8 mounted on a circuit carrier board for testing a semiconductor component to be tested.
Figure 15:
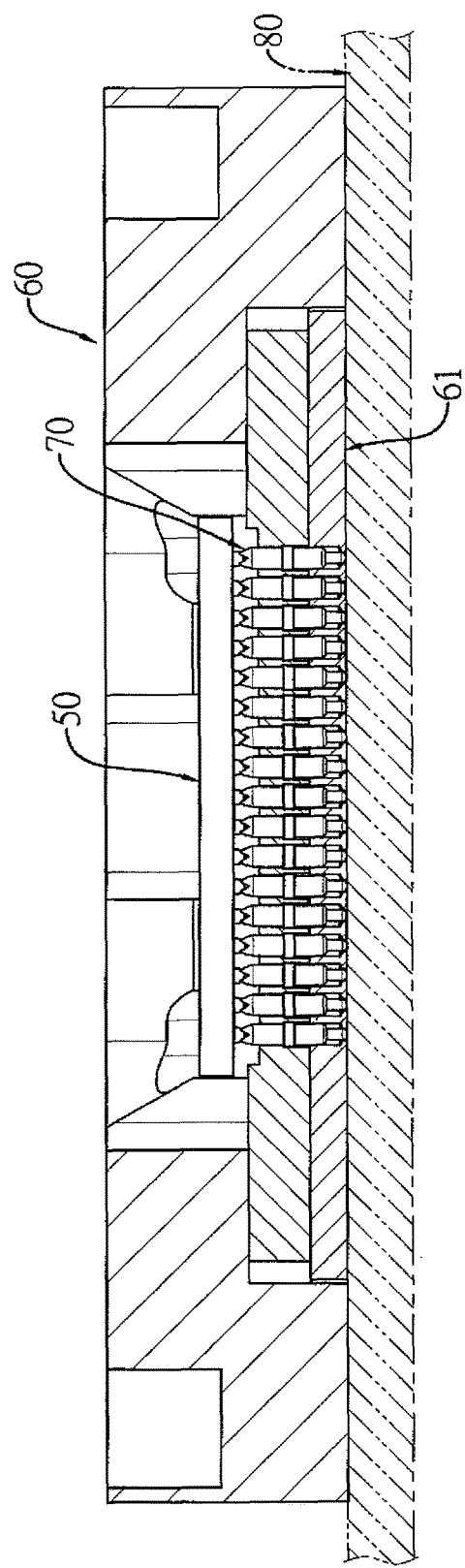
FIG. 15 is a partial cross-sectional view of a conventional probe connector assembly mounted on a circuit carrier board for testing a semiconductor component.

The probe connector assembly in accordance with the present invention can be applied to probe cards for wafer testing or various types of testing fixtures for semiconductor test equipment. In the case of semiconductor test equipment as shown in FIG. 14, the probe connector assembly combined with a carrier seat unit is mounted on a circuit carrier plate 40 of semiconductor test equipment (or on an additionally mounted circuit conversion interface of the circuit carrier plate 40). The probe tip 23C of each probe 20C is electrically connected to a corresponding contact point on the circuit carrier plate 40. When a semiconductor component 50 to be tested is placed on the probe connector assembly and a downward force is exerted on the semiconductor component 50, each contact point on a bottom of the semiconductor component 50 is electrically connected to the probe head 22C of a corresponding probe 20C for the semiconductor component 50 to electrically connect to the circuit carrier plate 40 of the semiconductor test equipment through multiple probes 20C of the probe connector assembly. The semiconductor test equipment further tests the semiconductor component 50 to determine if the semiconductor component 50 functions normally.

In sum, the probe connector assembly in accordance with the present invention employs multiple probes mounted in respective probe holes of a carrier plate and utilizes multiple positioning members to be securely mounted in the carrier plate, such that each positioning member is inserted into the probe holes to contact the probe trunk of a corresponding probe and the probe trunk of each probe is positioned in a corresponding probe hole of the carrier plate by friction resistance generated between the positioning member and the corresponding probe. The way of the probe, connector assembly in accordance with the present invention utilizing every positioning member to position few probes in the carrier plate simplifies structure of the carrier plate and eliminates the necessity of additionally mounting a probe cover on the board for mounting the probes in the existing probe connector assembly. Accordingly, issues concerning the mounting inconvenience arising from alignment between the probe cover and all of the probes and high cost can be tackled.

Meanwhile, due to the removal of the probe cover, the advantages of the probe connector assembly in accordance with the present invention include reduced thickness and length in the carrier plate and in the probe respectively, shorter signal transmission distance through the probes, and higher testing functions when the probe connector assembly is applied to all sorts of fixtures for testing.

Additionally, also because of the removal of the probe cover, during the course of probe installation and replacement, small amount of probes in the probe connector assembly may be directly and precisely replaced by tools to facilitate installation and replacement of the probes.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A probe connector assembly, comprising:
    a carrier plate having multiple probe holes spaced apart from each other and arranged in top-down alignment, wherein each probe hole has a hole portion and an end portion connected with one end of the hole portion and being smaller than the hole portion in diameter;
    multiple probes mounted in the respective probe holes of the carrier plate, each probe having:
        a probe trunk mounted inside the hole portion of a corresponding probe hole with one end of the probe trunk limited by the end portion of the corresponding probe hole;
        a probe head formed on a top end of the probe trunk and extending beyond a top surface of the carrier plate;
        a probe tip formed on a bottom end of the probe trunk; and
        a conducting part with an elastic portion being stretchable in length, wherein the elastic portion is selectively combined with one of the probe head and the probe tip; and
    multiple positioning members securely mounted into a bottom portion of the carrier plate, each positioning member partially protruding into the probe holes adjacent thereto to contact the probe trunks of the probes in the probe holes, wherein the probe trunk of each probe is positioned in the corresponding probe hole of the carrier plate by friction resistance generated between the probe trunk and the positioning members adjacent to the probe trunk.

2. The probe connector assembly as claimed in claim 1, wherein the carrier plate has multiple positioning recesses formed in one side thereof distal to the end portions of the probe holes, each probe hole communicates with the positioning recesses adjacent thereto, and the multiple positioning members are mounted in the respective positioning recesses.

3. The probe connector assembly as claimed in claim 2, wherein the multiple probe holes of the carrier plate are arranged in the form of a matrix, each positioning recess is a hole, each probe hole communicates with four positioning recesses adjacent thereto, each positioning member is one of a block and a sphere corresponding to the positioning recesses in shape, and the probe trunk of each probe is positioned in the corresponding probe hole of the carrier plate by friction resistance generated between the probe trunk and four positioning members adjacent to the probe trunk.

4. The probe connector assembly as claimed in claim 2, wherein the multiple probe holes of the carrier plate are arranged in the form of a matrix, each positioning recess is an elongated groove, each row of probe holes communicate with two positioning recesses adjacent thereto, each positioning member is a bar corresponding to the positioning recesses in shape, and the probe trunks of each row of probes are positioned in corresponding probe holes of the carrier plate by friction resistance generated between the probe trunks and two positioning members adjacent to the probe trunks.

5. The probe connector assembly as claimed in claim 1, wherein the multiple probe holes of the carrier plate are arranged in the form of a matrix, each positioning member is annular, and each positioning member is fixed in a corresponding probe hole of the carrier plate for the probe trunk of a corresponding probe to be positioned in the corresponding probe hole of the carrier plate by friction resistance generated between the positioning member and the probe trunk.

6. The probe connector assembly as claimed in claim 1, wherein the multiple probe holes of the carrier plate are arranged in the form of a matrix, each positioning member is annular, and each positioning member is fixed in an annular recess formed in one side of the carrier plate distal to the end portions of the probe holes and communicating with the corresponding probe hole for the probe trunk of a corresponding probe to be positioned in the annular recess by friction resistance generated between the positioning member and the probe trunk.

7. The probe connector assembly as claimed in claim 1, wherein the probe heads and the probe tips are both stretchable relative to the probe trunks of the probes, and the probe tips extend beyond a bottom surface of the carrier plate through bottom ends of the hole portions of the respective probe holes or are flush with the bottom surface of the carrier plate.

8. The probe connector assembly as claimed in claim 2, wherein the probe heads and the probe tips are both stretchable relative to the probe trunks of the probes, and the probe tips extend beyond a bottom surface of the carrier plate through bottom ends of the hole portions of the respective probe holes or are flush with the bottom surface of the carrier plate.

9. The probe connector assembly as claimed in claim 3, wherein the probe heads and the probe tips are both stretchable relative to the probe trunks of the probes, and the probe tips extend beyond a bottom surface of the carrier plate through bottom ends of the hole portions of the respective probe holes or are flush with the bottom surface of the carrier plate.

10. The probe connector assembly as claimed in claim 4, wherein the probe heads and the probe tips are both stretchable relative to the probe trunks of the probes, and the probe tips extend beyond a bottom surface of the carrier plate through bottom ends of the hole portions of the respective probe holes or are flush with the bottom surface of the carrier plate.

11. The probe connector assembly as claimed in claim 5, wherein the probe heads and the probe tips are both stretchable relative to the probe trunks of the probes, and the probe tips extend beyond a bottom surface of the carrier plate through bottom ends of the hole portions of the respective probe holes or are flush with the bottom surface of the carrier plate.

12. The probe connector assembly as claimed in claim 6, wherein the probe heads and the probe tips are both stretchable relative to the probe trunks of the probes, and the probe tips extend beyond a bottom surface of the carrier plate through bottom ends of the hole portions of the respective probe holes or are flush with the bottom surface of the carrier plate.

13. The probe connector assembly as claimed in claim 1, wherein the probe heads are stretchable relative to the probe trunks, the probe tips are fixedly attached to the bottom ends of the probe trunks, and tip portions of the probe tips are flush with a bottom surface of the carrier plate.

14. The probe connector assembly as claimed in claim 2, wherein the probe heads are stretchable relative to the probe trunks, the probe tips are fixedly attached to the bottom ends of the probe trunks, and tip portions of the probe tips are flush with a bottom surface of the carrier plate.

15. The probe connector assembly as claimed in claim 3, wherein the probe heads are stretchable relative to the probe trunks, the probe tips are fixedly attached to the bottom ends of the probe trunks, and tip portions of the probe tips are flush with a bottom surface of the carrier plate.

16. The probe connector assembly as claimed in claim 4, wherein the probe heads are stretchable relative to the probe trunks, the probe tips are fixedly attached to the bottom ends of the probe trunks, and tip portions of the probe tips are flush with a bottom surface of the carrier plate.

17. The probe connector assembly as claimed in claim 5, wherein the probe heads are stretchable relative to the probe trunks, the probe tips are fixedly attached to the bottom ends of the probe trunks, and tip portions of the probe tips are flush with a bottom surface of the carrier plate.

18. The probe connector assembly as claimed in claim 6, wherein the probe heads are stretchable relative to the probe trunks, the probe tips are fixedly attached to the bottom ends of the probe trunks, and tip portions of the probe tips are flush with a bottom surface of the carrier plate.

* * * * *